United States Patent
Morishita et al.

(10) Patent No.: US 11,764,029 B2
(45) Date of Patent: Sep. 19, 2023

(54) METHOD OF MEASURING ABERRATION AND ELECTRON MICROSCOPE

(71) Applicant: JEOL Ltd., Tokyo (JP)

(72) Inventors: Shigeyuki Morishita, Tokyo (JP); Ryusuke Sagawa, Tokyo (JP); Fuminori Uematsu, Tokyo (JP); Tomohiro Nakamichi, Tokyo (JP); Keito Aibara, Tokyo (JP)

(73) Assignee: JEOL Ltd., Tokyo (JP)

( * ) Notice: Subject to any disclaimer, the term of this patent is extended or adjusted under 35 U.S.C. 154(b) by 128 days.

(21) Appl. No.: 17/576,016

(22) Filed: Jan. 14, 2022

(65) Prior Publication Data

US 2022/0230838 A1 Jul. 21, 2022

(30) Foreign Application Priority Data

Jan. 18, 2021 (JP) ................................ 2021-005612

(51) Int. Cl.
*H01J 37/153* (2006.01)
*H01J 37/10* (2006.01)
*H01J 37/26* (2006.01)

(52) U.S. Cl.
CPC ............ *H01J 37/153* (2013.01); *H01J 37/10* (2013.01); *H01J 37/26* (2013.01); *H01J 2237/1534* (2013.01)

(58) Field of Classification Search
CPC .......... H01J 37/153; H01J 37/10; H01J 37/26; H01J 2237/1534
See application file for complete search history.

(56) References Cited

U.S. PATENT DOCUMENTS

| 2007/0120055 A1 | 5/2007 | Sawada et al. |
| 2009/0268969 A1 | 10/2009 | Thust et al. |
| 2013/0099117 A1 | 4/2013 | Akima et al. |
| 2015/0287568 A1 | 10/2015 | Rodgers et al. |

FOREIGN PATENT DOCUMENTS

| JP | 2007180013 A | 7/2007 |
| JP | 201518721 A | 1/2015 |

OTHER PUBLICATIONS

Extended European Search Report issued in EP21213088.4 dated Jun. 15, 2022.
Van der Hoeven et al., Alignment Control of STEM: a Ronchigram Based Approach, Microscopy and Microanalysis, vol. 15, No. S2, Jul. 1, 2009, pp. 118-119.

*Primary Examiner* — Nicole M Ippolito
*Assistant Examiner* — Hanway Chang
(74) *Attorney, Agent, or Firm* — THE WEBB LAW FIRM

(57) ABSTRACT

A method of measuring an aberration in an electron microscope includes: acquiring an image for measuring the aberration in the electron microscope; and measuring the aberration by using the image. In measuring the aberration, a direction of defocusing is specified based on a residual aberration that is uniquely determined by a configuration of an optical system of the electron microscope and an optical condition of the optical system.

13 Claims, 10 Drawing Sheets

METHOD OF MEASURING ABERRATION AND ELECTRON MICROSCOPE

CROSS REFERENCE TO RELATED APPLICATION

This application claims priority to Japanese Patent Application No. 2021-005612 filed Jan. 18, 2021, the disclosure of which is hereby incorporated by reference in its entirety.

BACKGROUND OF THE INVENTION

Field of the Invention

The present invention relates to a method of measuring an aberration and an electron microscope.

Description of Related Art

In order to perform high resolution observation using an electron microscope, such as a transmission electron microscope (TEM) and a scanning transmission electron microscope (STEM), correcting an aberration generated in an optical system is extremely important.

It is necessary to measure an aberration in order to correct the aberration. Known methods of measuring an aberration are: a method of measuring an aberration using a diffractogram tableau; and a method of measuring an aberration using a Ronchigram.

For example, JP-A-2007-180013 discloses a method of measuring an aberration using the Ronchigram.

The diffractogram, which is a pattern that easily reflects an aberration, is used for measuring an aberration. However, in the case of the diffractogram, the direction of defocusing, i.e., (whether the defocusing is an overfocus or underfocus, cannot be determined if only one pattern is used. Therefore it is necessary to check the direction of defocusing in advance using a different means, or to calculate the aberration by using a plurality of diffractograms acquired by changing defocusing.

For example, in the case of measuring an aberration using the diffractogram tableau, the direction of defocusing is determined from the state of change of defocusing when the height of the specimen or excitation of the objective lens are changed, whereby a diffractogram is acquired. If the determination of the direction of defocusing is incorrect at this time, the aberration cannot be calculated accurately from the diffractogram tableau.

In the case of the Ronchigram as well, the direction of defocusing cannot be determined by one pattern alone, hence it is necessary to check the direction of defocusing in advance using a different means, or to calculate the aberration by using a plurality of Ronchigrams acquired by changing defocusing.

As a method of measuring an aberration using a Ronchigram, a Segmental-Ronchigram-Autocorrection function-Matrix (SRAM) method, for example, is known. In the case of the SRAM method, an aberration is calculated using a plurality of Ranchigrams having different defocusings.

As described above, in order to measure an aberration, it is necessary to acquire information on a direction of defocusing in advance, or to acquire a plurality of images for measuring an aberration by changing defocusing.

SUMMARY OF THE INVENTION

According to a first aspect of the invention, there is provided a method of measuring an aberration in an electron microscope, the method including:

acquiring an image for measuring an aberration in the electron microscope; and measuring an aberration by using the image, in measuring an aberration, a direction of defocusing being specified based on a residual aberration that is uniquely determined by a configuration of an optical system of the electron microscope and an optical condition of the optical system.

According to a second aspect of the invention, there is provided an electron microscope including:

an electron source that emits an electron beam;

an optical system that acts on the electron beam;

a detector for acquiring an image for measuring an aberration; and an aberration calculating unit that calculates an aberration by using the image, the aberration calculating unit specifying a direction of defocusing based on a residual aberration that is uniquely determined by configuration of the optical system and an optical condition of the optical system.

DESCRIPTION OF THE INVENTION

According to an embodiment of the invention, there is provided a method of measuring an aberration in an electron microscope, the method including:

acquiring an image for measuring an aberration in the electron microscope; and measuring an aberration by using the image, in measuring an aberration, a direction of defocusing being specified based on a residual aberration that is uniquely determined by a configuration of an optical system of the electron microscope and an optical condition of the optical system.

In this method of measuring an aberration, a direction of defocusing is specified based on a residual aberration that is uniquely determined by a configuration of the optical system and an optical condition of the optical system. Therefore an aberration can be easily measured without acquiring information on a direction of defocusing in advance, or acquiring a plurality of images for measuring an aberration by changing defocusing.

According to an embodiment of the invention, there is provided an electron microscope including:

an electron source that emits an electron beam;
an optical system that acts on the electron beam;
a detector for acquiring an image for measuring an aberration; and
an aberration calculating unit that calculates an aberration by using the image,
the aberration calculating unit specifying a direction of defocusing based on a residual aberration that is uniquely determined by a configuration of the optical system and an optical condition of the optical system.

In this electron microscope, the aberration calculating unit specifies a direction of defocusing based on a residual aberration that is uniquely determined by a configuration of the optical system and an optical condition of the optical system. Therefore an aberration can be easily measured without acquiring information on a direction of defocusing in advance, or acquiring a plurality of images for measuring an aberration by changing defocusing.

Preferred embodiments of the invention will be described in detail below with reference to the drawings. It is noted that the following embodiments are not unduly limit the scope of the invention as stated in the claims. In addition, all of the components described in the following embodiments are not necessarily essential requirements of the invention.

1. First Embodiment 1.1. Electron Microscope

Figure 1:
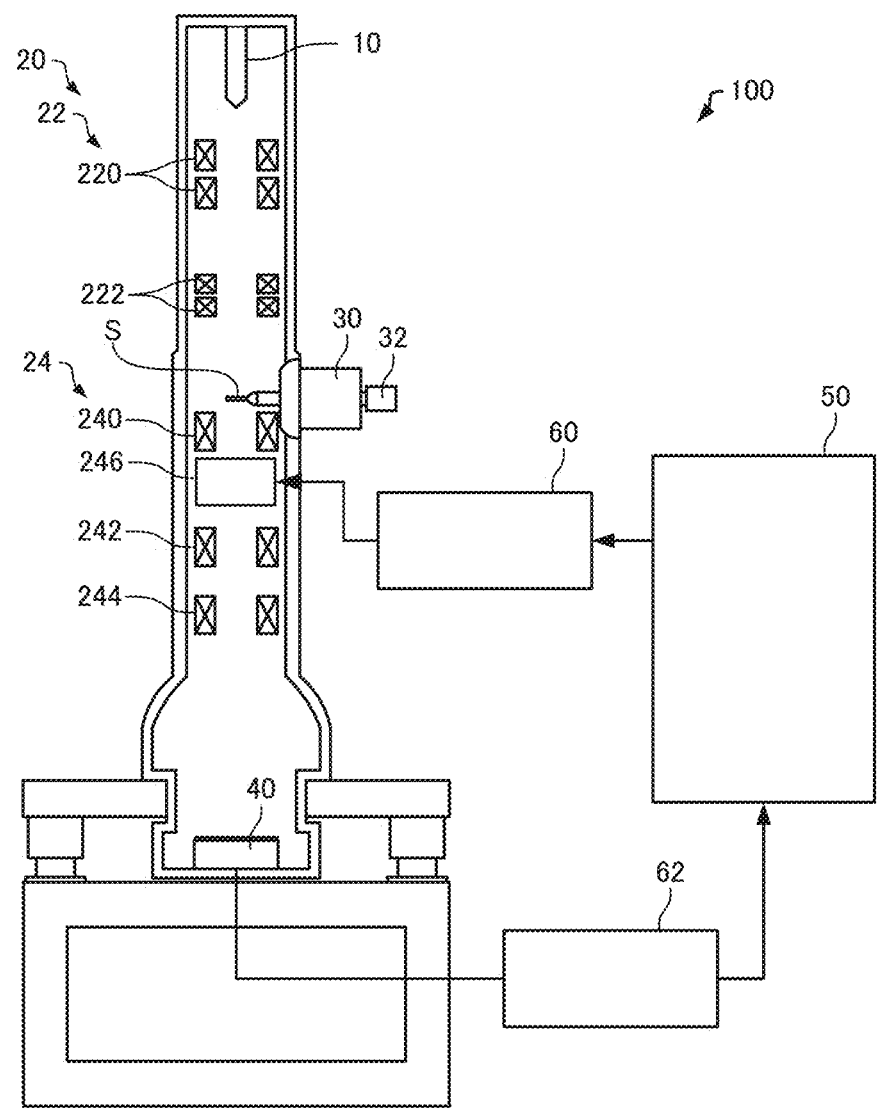
FIG. 1 is a diagram illustrating a configuration of an electron microscope according to the first embodiment.

First an electron microscope according to the first embodiment will be described with reference to the drawings. FIG. 1 is a diagram illustrating a configuration of the electron microscope 100 according to the first embodiment.

The electron microscope 100 is a transmission electron microscope (TEM). In the electron microscope 100, an electron beam emitted from an electron source 10 is focused by an illumination system 22 and is emitted to a specimen S. The electron beam transmitted through the specimen S forms a transmission electron microscopic image (TEM image) via an imaging system 24. The TEM image is captured by a detector 40. In the electron microscope 100, an aberration of the imaging system 24 can be corrected by an aberration correction device 246, hence a high resolution TEM image can be acquired.

As illustrated in FIG. 1, the electron microscope 100 includes the electron source 10, an optical system 20, a specimen stage 30, a specimen holder 32, a detector 40 and a control device 50.

The electron source 10 generates electrons. The electron source 10 is an electron gun which accelerates electrons, emitted from a cathode, by an anode, and emits an electron beam.

The optical system 20 acts on the electron beam emitted from the electron source 10. The optical system 20 includes the illumination system 22 and the imaging system 24.

The illumination system 22 is an optical system to irradiate the specimen S with an electron beam emitted from the electron source 10. The illumination system 22 includes a focusing lens 220 and a deflector 222.

The focusing lens 220 focuses an electron beam emitted from the electron source 10. The focusing lens 220 may be constituted of a plurality of electron lenses.

The deflector 222 deflects an electron beam emitted from the electron source 10. The deflector 222 deflects the electron beam two-dimensionally. By deflecting the electron beam using the deflector 222, an incident angle of the electron beam, with respect to the specimen S, can be changed.

The imaging system 24 forms a TEM image using an electron beams transmitted through the specimen S. The imaging system 24 includes an objective lens 240, an intermediate lens 242, a projection lens 244 and the aberration correction device 246.

The objective lens 240 is a lens on a first stage to form a TEM image using an electron beam transmitted through the specimen S. The intermediate lens 242 and the projection lens 244 enlarge the image formed by the objective lens 240, and forms an image on the detector 40.

The aberration correction device 246 is incorporated into the imaging system 24. The aberration correction device 246 corrects an aberration of the imaging system 24.

For example, the aberration correction device 246 generates a negative spherical aberration, and cancels out a positive spherical aberration of the objective lens 240. The aberration correction device 246 is a two-stage hexapole field type spherical aberration correction device which includes two hexapoles having opposite polarities and a transfer lens connecting the two hexapoles, for example. In the aberration correction device 246, three-fold symmetrical magnetic fields, which are in an opposite direction from each other, are formed by the two hexapoles, whereby the spherical aberrations and the like are corrected. An aberration correction power supply controller 60 operates the aberration correction device 246.

The specimen stage 30 supports a specimen S held by the specimen holder 32. The specimen S can be positioned by the specimen stage 30.

The detector 40 detects electrons transmitted through the specimen S. The detector 40 captures an image formed by the imaging system 24. The detector 40 is a digital camera, such as a charge coupled device (CCD) camera. A detector control system 62 controls the detector 40. The detector control system 62 sends the image captured by the detector 40 to the control device 50.

The control device 50 controls the aberration correction device 246. The control device 50 generates a control signal to control the aberration correction device 246, and sends the control signal to the aberration correction power supply controller 60. The aberration correction power supply controller 60 operates the aberration correction device 246 based on the control signal.

Figure 2:
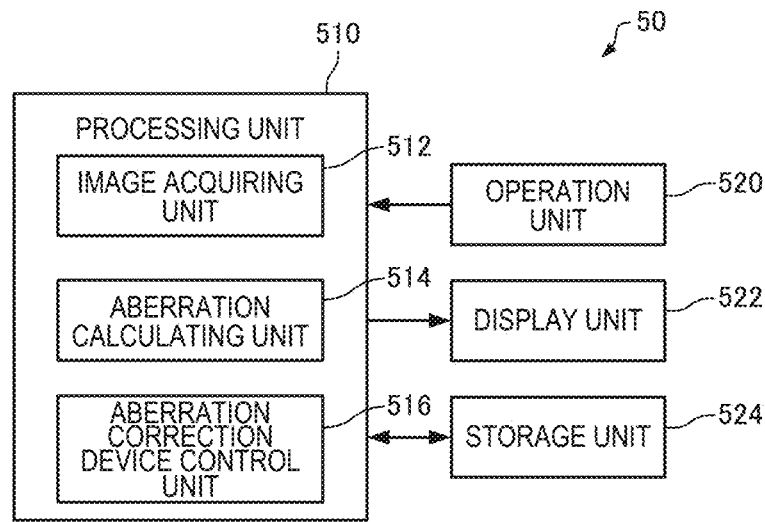
FIG. 2 is a diagram illustrating a configuration of a control device.

FIG. 2 is a diagram illustrating a configuration of the control device 50.

As indicated in FIG. 2, the control device 50 includes: a processing unit 510, an operation unit 520, a display unit 522 and a storage unit 524.

The operation unit 520 acquires an operation signal corresponding to the operation performed by the user, and sends the operation signal to the processing unit 510. The functions of the operation unit 520 are implemented by buttons, keys, a touch panel type display, a microphone and the like.

The display unit 522 display an image generated by the processing unit 510, and the functions of the display unit 522 can be implemented by such a display as a liquid crystal display (LCD). A graphical user interface (GUI), to control the later mentioned aberration correction device 246, is displayed on the display unit 522.

The storage unit 524 stores programs, data and the like for the processing unit 510 to perform various types of calculation processing operations and control processing operations. Further, the storage unit 524 is used as a work area of the processing unit 510, and is also used for temporarily storing calculation results and the like, executed by the processing unit 510 in accordance with various programs. The functions of the storage unit 524 can be implemented by a hard disk, a random access memory (RAM), and the like.

The processing unit 510 performs processing to control the aberration correction device 246. The processing performed by the processing unit 510 will be described later. The functions of the processing unit 510 can be implemented by various processors (e.g. central processing unit (CPU)) executing programs. The processing unit 510 includes an image acquiring unit 512, an aberration calculating unit 514, and an aberration correction device control unit 516.

The image acquiring unit 512 acquires an image to measure an aberration. An image to measure an aberration is a diffractogram tableau, for example. The diffractogram tableau is an image to measure an aberration of the imaging system 24. The diffractogram tableau two-dimensionally displays a plurality of diffractograms, of which incident angles of an electron beam with respect to the specimen S are mutually different. The diffractogram tableau is a graphic acquired by Fourier-transforming a high magnification image of an amorphous specimen.

The aberration calculating unit 514 measures an aberration of the optical system 20 using an image for measuring an aberration. Here, the aberration calculating unit 514 measures an aberration of the imaging system 24 using the diffractogram tableau. First the aberration calculating unit 514 specifies a direction of defocusing based on the residual aberration that is uniquely determined by the configuration of the optical system 20 and the optical conditions of the optical system 20 and determines aberrations other than defocusing based on the specified direction of defocusing. The processing by the aberration calculating unit 514 will be described in detail later.

The aberration correction device control unit 516 operates the aberration correction device 246 based on the aberration calculated by the aberration calculating unit 514. The aberration correction device control unit 516 operates the aberration correction device 246 so that an aberration to cancel out the aberration calculated by the aberration calculating unit 514 is generated. Thereby the aberration of the imaging system 24 can be corrected.

1.2. Method of Measuring Aberration

A method of measuring an aberration according to the first embodiment will be described next. In the following, a method of measuring an aberration using a diffractogram tableau will be described.

In a method of measuring an aberration using a diffractogram tableau, information on the direction of defocusing during the measurement, that is, information on whether defocusing is underfocus or overfocus, is normally required. Therefore it is necessary to check the direction of defocusing using a different means in advance, or to calculate an aberration by using a plurality of diffractograms acquired by changing defocusing.

Whereas in the case of the method of measuring an aberration according to the first embodiment, which will be described below, an aberration can be accurately calculated without acquiring the information on the direction of defocusing in advance.

For example, in the aberration correction device 246, a high order aberration is generated as a residual aberration. In a case where the aberration correction device 246 is a two-stage hexapole field type spherical aberration correction device, a six-fold astigmatism or a sixth order three-lobe aberration is generated in the aberration correction device 246. These high order aberrations, unlike other low order aberrations, cannot be corrected by adjusting the optical elements. In other words, these high order aberrations do not change once the configuration of the optical system 20 and the optical conditions of the optical system 20 are determined.

The configuration of the optical system 20 includes a configuration of each optical element (lens, aperture, multi-pole, aberration correction device, and the like) included in the optical system 20, and the dimensions and position of each optical element. The optical conditions include the acceleration voltage and conditions of each optical element.

For example, the direction of the six-fold astigmatism and the direction of the sixth order three-lobe aberration generated in the aberration correction device 246 are uniquely determined depending on the configuration of the optical system 20 (e.g. a number of poles, direction of multi-poles), the excitation current applied to the multi-poles, acceleration voltage and conditions of each optical element constituting the optical system 20. Therefore the direction of the six-fold astigmatism and the direction of the six-fold order three-lobe aberration generated in the aberration correction device 246 can be known in advance.

In the method of measuring an aberration according to the first embodiment, the direction of defocusing is specified based on the residual aberration which is uniquely determined by the configuration of the optical system 20 and the optical conditions of the optical system 20, and the aberrations other than defocusing are determined based on the specified direction of defocusing.

Figure 3:
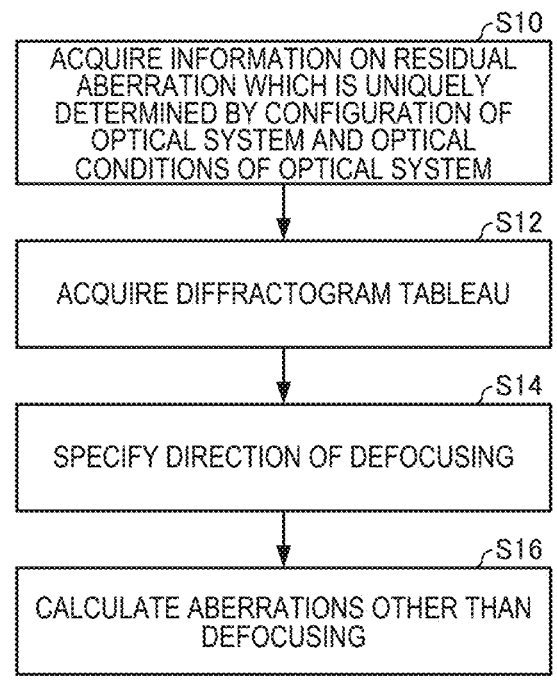
FIG. 3 is a flow chart illustrating an example of a method of measuring an aberration according to the first embodiment.

FIG. 3 is a flow chart illustrating an example of the method of measuring an aberration according to the first embodiment. In the following, a case where the six-fold astigmatism is generated as the residual aberration of the aberration correction device 246 will be described.

First, the information on the residual aberration that is uniquely determined by the configuration of the optical system 20 and the optical conditions of the optical system 20 is acquired (S10).

For example, in the electron microscope 100, the aberration is measured while changing the optical conditions of the optical system 20, whereby a table, in which the optical conditions of the optical system 20 and the direction of the residual aberration (six-fold astigmatism) of the aberration correction device 246 are associated and registered, is created.

Then a diffractogram tableau is acquired (S12).

Specifically, an amorphous image is acquired at high magnification while changing the incident angle of the electron beam with respect to the specimen S, and the acquired amorphous image is Fourier-transformed. Thereby a plurality of diffractograms of which incident angles of the electron beam are different from each other can be acquired. The diffractogram tableau can be acquired by two-dimensionally disposing the plurality of diffractograms.

Then the direction of defocusing is specified based on the residual aberration, which is uniquely determined by the configuration of the optical system 20 and the optical conditions of the optical system 20 (S14), and the aberrations other than defocusing are determined based on the specified direction of defocusing (S16).

Based on the assumption (constraint condition) that the six-fold astigmatism, which is the residual aberration of the aberration correction device 246, exists, the direction of defocusing is specified using the diffractogram tableau acquired in step S12.

For example, it is assumed that the focus is underfocus, and the aberration is calculated using the diffractogram tableau. Then it is assumed that the defocusing is overfocus, and the aberration is calculated by using the diffractogram tableau. Then, with reference to the table created in step S10, information on the direction of the six-fold astigmatism of the aberration correction device 246, in accordance with the optical conditions used when the diffractogram tableau was acquired in step S12, is acquired. Then one of the aberration calculation result in the case where the focus was assumed to be underfocus, and the aberration calculation result in the case where defocusing was assumed to be overfocus, of which direction of the six-fold astigmatism matches with the acquired information, is used as the correct calculation result.

Figure 4:
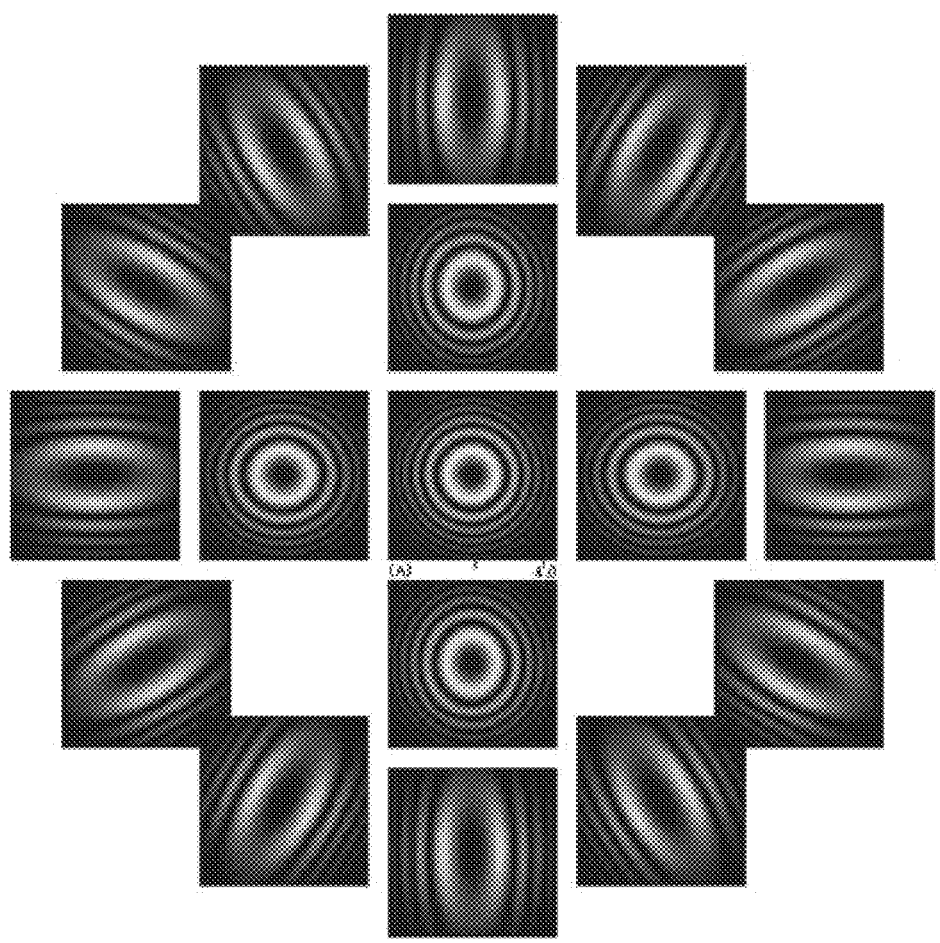
FIG. 4 illustrates a simulation result of a diffractogram tableau in a case where positive spherical aberration exists.
Figure 5:
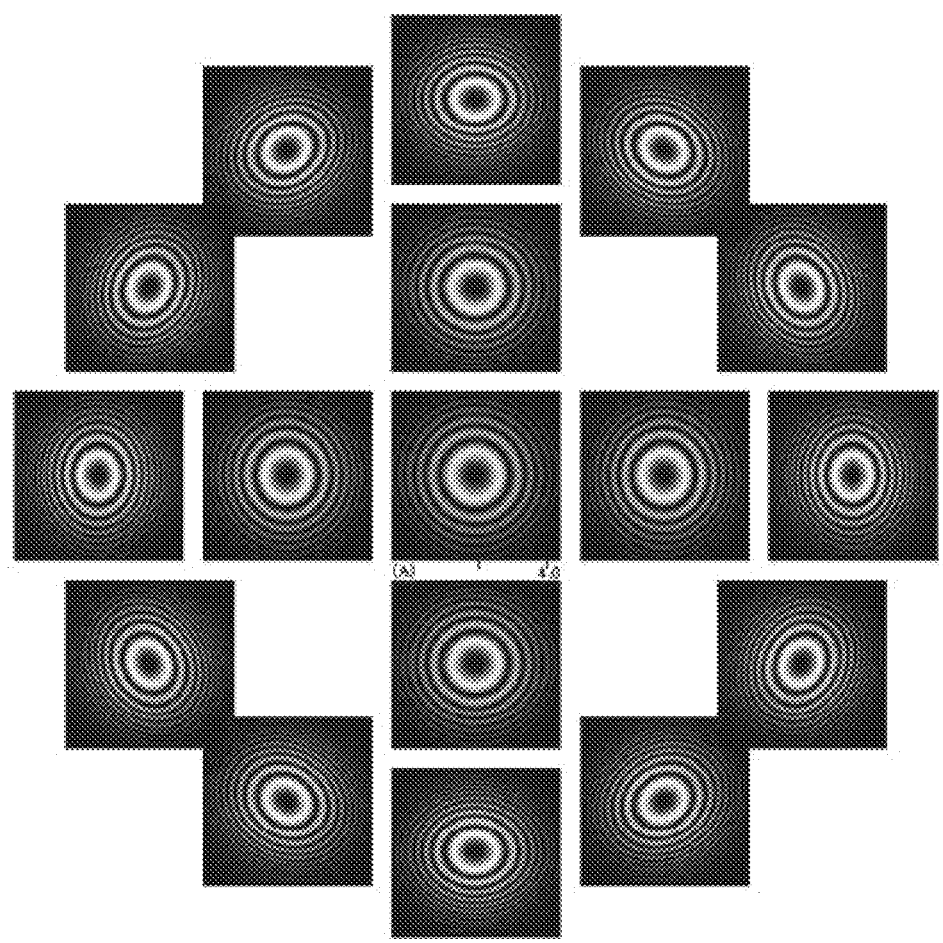
FIG. 5 illustrates a simulation result of a diffractogram tableau in a case where positive spherical aberration exists.

FIG. 4 an FIG. 5 are simulation results of the diffractogram tableau in a case where positive spherical aberration exists. FIG. 4 is a case where defocusing is underfocus, and FIG. 5 is a case where defocusing is overfocus.

Even in a case where the same positive spherical aberration exists, a pattern of the diffractogram tableau changes if the direction of defocusing changes. In the method of measuring an aberration according to the first embodiment, the aberration can be measured regardless the direction of defocusing with which the diffractogram tableau is acquired, since the information on the direction of the residual aberration of the aberration correction device 246 is used.

Figure 6:
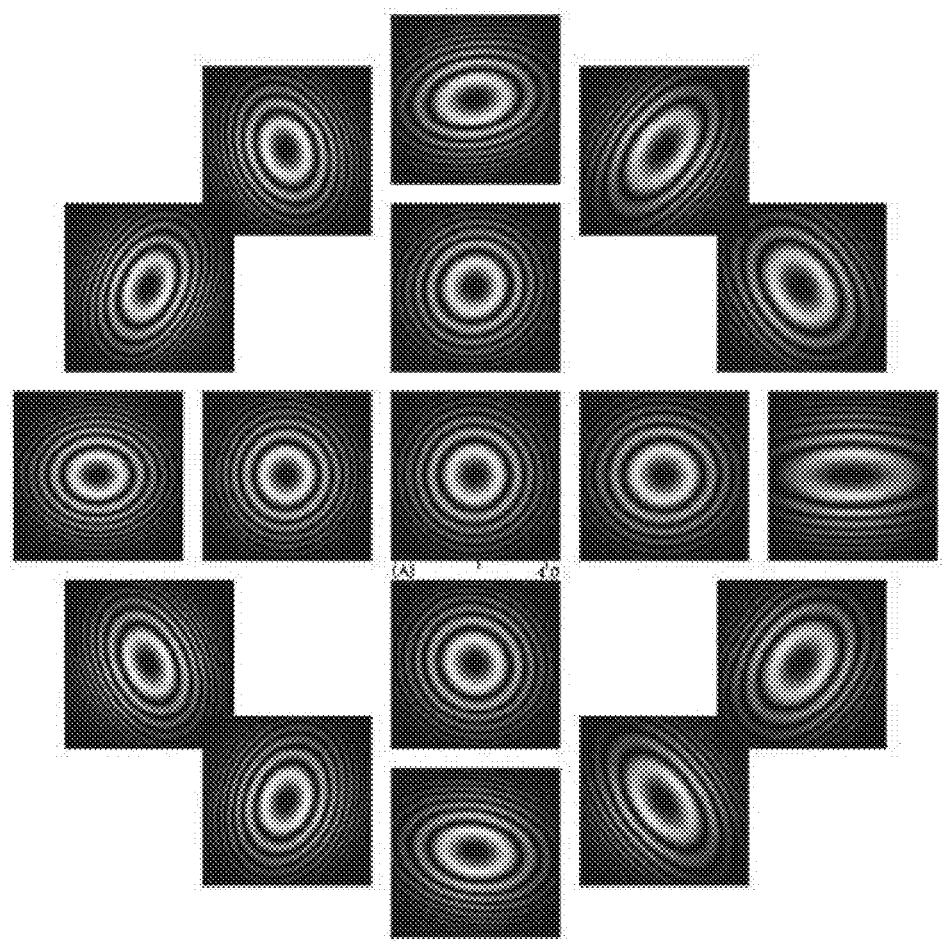
FIG. 6 illustrates an example of a simulation result of a diffractogram tableau.

FIG. 6 is an example of a simulation result of the diffractogram tableau. When the aberration is calculated using the diffractogram tableau indicated in FIG. 6, solution A and solution B are acquired as follows.

Solution A
Defocusing: −300 nm
Coma aberration: 200 nm, 0°
Six-fold astigmatism: 5 mm, 0°
Solution B
Defocusing: +300 nm
Coma aberration: 200 nm, 180°
Six-fold astigmatism: 5 mm, 30°

Here, if it is known that the direction of the six-fold astigmatism generated in the aberration correction device 246 is 30°, then solution B is the correct aberration measuring result.

In the above mentioned example, the direction of the six-fold astigmatism generated in the aberration correction device 246 that is uniquely determined is used, but the direction of the sixth order three-lobe aberration generated in the aberration correction device 246 is also uniquely determined by the configuration of the optical system 20 and the optical conditions of the optical system 20. Therefore based on the assumption (constraint condition) that the sixth order three-lobe aberration, which is the residual aberration of the aberration correction device 246, exists, the direction of defocusing may be specified using the diffractogram tableau acquired in step S12.

1.3. Processing

In the electron microscope 100, the control device 50 performs the aberration measurement processing to measure an aberration of the imaging system 24. Further, the control device 50 performs the aberration correction processing to correct the aberration by controlling the aberration correction device 246 based on the aberration measuring result. In the storage unit 524, a table in which the optical conditions of the optical system 20 and the direction of the six-fold astigmatism are associated and registered, is stored in advance.

Figure 7:
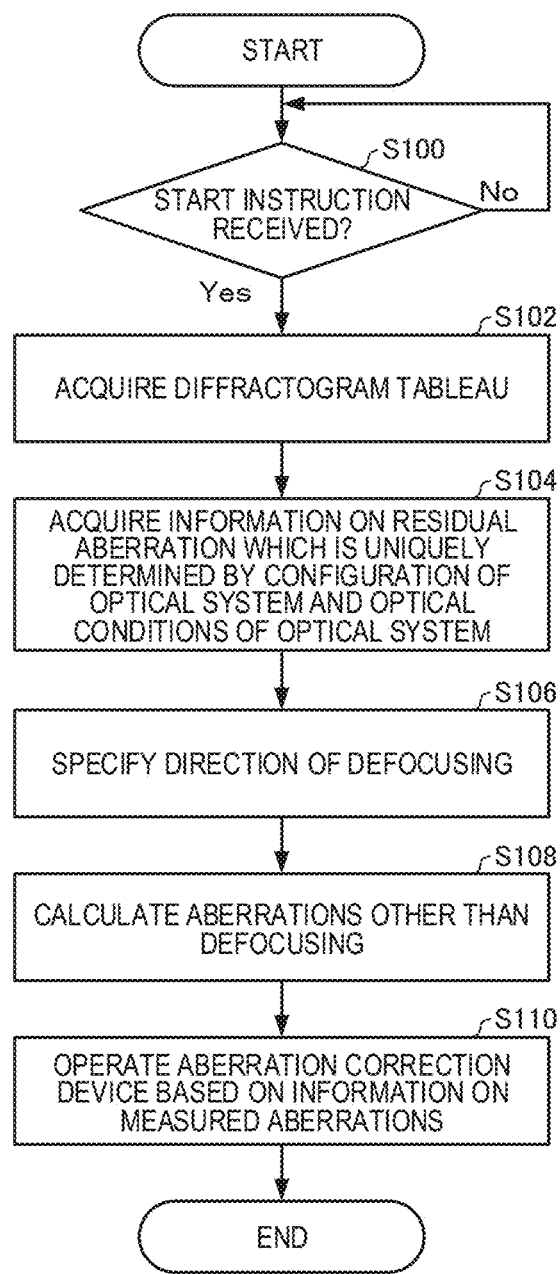
FIG. 7 is a flow chart illustrating an example of aberration measurement processing and aberration correction processing.

FIG. 7 is a flow chart illustrating an example of the aberration measurement processing and the aberration correction processing.

The processing unit 510 determines whether the user instructed a start of aberration correction (S100). For example, the processing unit 510 determines that the start was instructed when the user operated the operation unit 520 to input an instruction to start the aberration correction.

In a case where it is determined that the start was instructed (Yes in S100), the image acquiring unit 512 performs the processing to acquire the diffractogram tableau (S102). For example, the image acquiring unit 512 acquires amorphous images at high magnification, captured by the detector 40, while changing the incident angle of the electron beam with respect to the specimen S by controlling the optical system 20. Then the image acquiring unit 512 Fourier-transforms the acquired amorphous images, of which incident angles are different from each other, to generate diffractograms, and two-dimensionally disposes the diffractograms. Thereby the diffractogram tableau can be acquired.

Then the aberration calculating unit 514 measures the aberration using the diffractogram tableau acquired by the image acquiring unit 512.

Specifically, first the aberration calculating unit 514 acquires the information on the residual aberration that is uniquely determined by the configuration of the optical system 20 and the optical conditions of the optical system 20 (S104).

With reference to the table stored in the storage unit 524, the aberration calculating unit 514 acquires the information on the direction of the six-fold astigmatism, in accordance with the optical conditions used when the image acquiring unit 512 acquired the diffractogram tableau. Then in the diffractogram tableau, the aberration calculating unit 514 specified the direction of defocusing based on the acquired information on the direction of the six-fold astigmatism (S106), and determines the aberrations other than defocusing based on the specified direction of defocusing (S108). The aberration of the optical system 20 can be measured by the above processing. The aberration measurement result may be displayed on the display unit 522, for example. After the processing step S108, the processing unit 510 ends the aberration measurement processing.

After the aberration measurement processing ends, the aberration correction device control unit 516 operates the aberration correction device 246 so that the aberration is corrected based on the information on the measured aberration (S110). By the above processing steps, the aberration of the imaging system 24 can be corrected. After the processing step S110, the processing unit 510 ends the aberration correction processing.

1.4. Effects

In the electron microscope 100, the aberration calculating unit 514 specifies the direction of defocusing based on the residual aberration that is uniquely determined by the configuration of the optical system 20 and the optical conditions of the optical system 20. Therefore an aberration can be easily measured without checking the direction of defocusing in advance or changing defocusing. Furthermore, the aberration can be measured using one diffractogram tableau without acquiring a plurality of diffractogram tableaux.

1.5. Modification

In the above embodiment, the direction of the six-fold astigmatism or the direction of the sixth order three-lobe aberration generated in the aberration correction device 246 to correct the spherical aberration, that is uniquely determined, is used, but a high order residual aberration, that is generated in the aberration correction device used for correcting a chromatic aberration and other aberrations, is also uniquely determined in the same manner. Therefore the direction of defocusing may be specified using the residual aberration that is generated in the aberration correction device used for correcting a chromatic aberration and other aberrations.

For example, in the objective lens 240, a positive spherical aberration (third order spherical aberration) is normally generated. This positive spherical aberration is uniquely determined by the configuration of the optical system 20 and the optical conditions of the optical system 20. Therefore the direction of defocusing may be specified using the spherical aberration generated in the objective lens 240. In the same manner, the fifth order star aberration (or seventh order star aberration), which is generated in a quadrupole field type aberration correction device or octupole field type aberration correction device, is also uniquely determined by the configuration of the optical system 20 and the optical conditions of the optical system 20. Furthermore, the sixth order three-lobe aberration, which is generated in the three-stage hexapole field type aberration correction device, is also uniquely determined by the configuration of the optical system 20 and the optical conditions of the optical system 20. Therefore the direction of defocusing may be specified using these aberrations.

2. Second Embodiment

2.1. Electron Microscope

Figure 8:
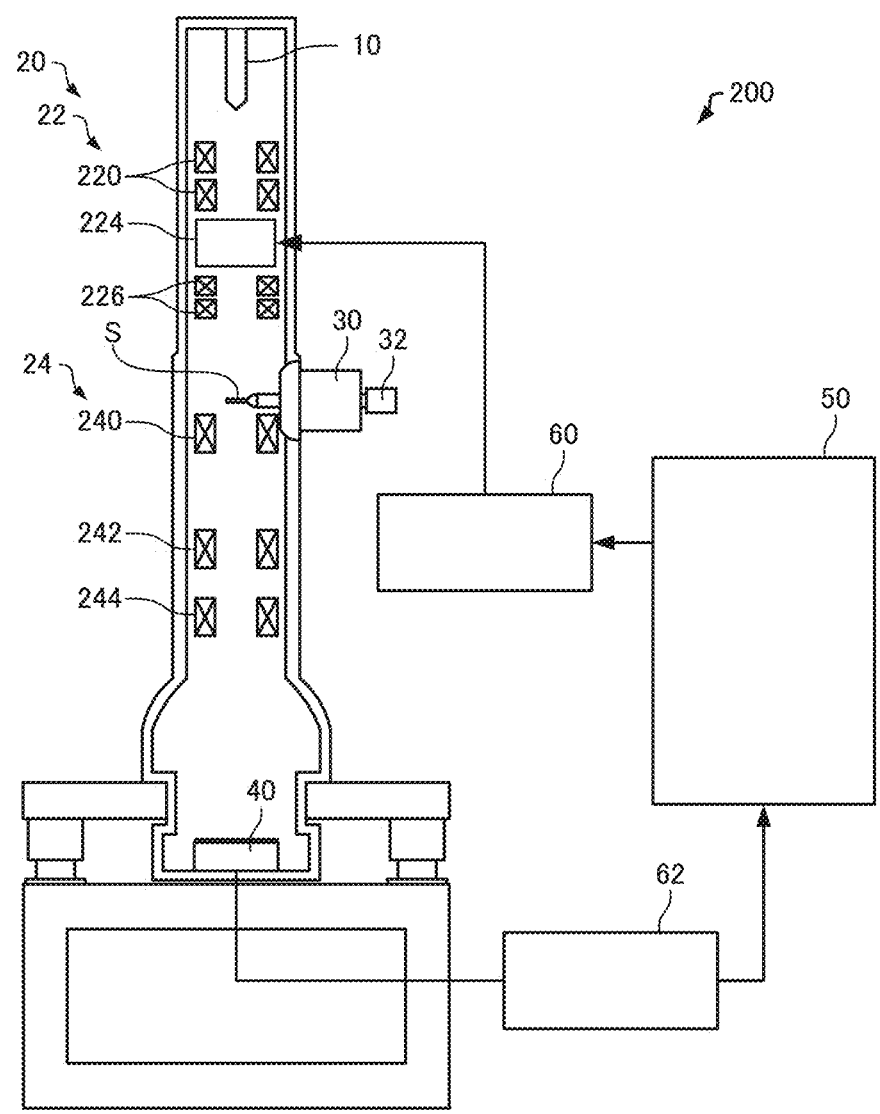
FIG. 8 is a diagram illustrating a configuration of an electron microscope according to the second embodiment.

An electron microscope according to the second embodiment will be described next with reference to the drawings. FIG. 8 is a diagram illustrating a configuration of the electron microscope 200 according to the second embodiment. In the electron microscope 200 according to the second embodiment, a composing element having a same function as a composing element of the electron microscope 100 according to the first embodiment is denoted with a same reference sign, and detailed description thereof is omitted.

In the above mentioned electron microscope 100 illustrated in FIG. 1, the aberration correction device 246 is incorporated into the imaging system 24. In the case of the electron microscope 200 illustrated in FIG. 8, on the other hand, an aberration correction device 224 is incorporated into the illumination system 22. In other words, the illumination system 22 includes the aberration correction device 224.

Further, in the case of the electron microscope 200, the illumination system 22 includes a scanning coil 226. The scanning coil 226 is used to scan a specimen S with an electron beam.

The electron microscope 200 is a scanning transmission electron microscope (STEM). In the electron microscope 200, the electron beam emitted from the electron source 10 is focused via the focusing lens 220 and the objective lens 240, and forms an electron probe. The formed-electron prove is two-dimensionally deflected by the scanning coil 226. Thereby the specimen S can be scanned by the electron probe. A scanning transmission electron microscope image (STEM image) can be acquired by detecting electrons transmitted through the specimen S using the detector 40, synchronizing with the scanning by the electron probe.

The aberration correction device 224 corrects the aberration of the illumination system 22. The aberration correction device 224 is a two-stage hexapole field type spherical aberration correction device, for example, just like the aberration correction device 246.

The detector 40 detects electrons transmitted though the specimen S. The detector 40 may be an annular detector that detects electrons scattered by the specimen S.

2.2. Method of Measuring Aberration

A method of measuring an aberration according to the second embodiment will be described next. In the following, a method of measuring an aberration using a Ronchigram will be described.

In a method of measuring an aberration using a Ronchigram, information on the direction of defocusing during the measurement is normally required. Therefore it is necessary to check the direction of defocusing using a different means in advance, or to calculate the aberration using a plurality of Ronchigrams acquired by changing defocusing.

Whereas in the case of the method of measuring an aberration according to the second embodiment, which will be described below, an aberration can be accurately calculated without acquiring the information on the direction of defocusing in advance.

For example, in the aberration correction device 224, a high order aberration is generated as a residual aberration. In a case where the aberration correction device 224 is a two-stage hexapole field type spherical aberration correction device, a six-fold astigmatism or sixth order three-lobe aberration is generated in the aberration correction device 224.

In the method of measuring an aberration according to the second embodiment, just like the case of the method of measuring an aberration according to the first embodiment, the direction of defocusing is specified based on the residual aberration which is uniquely determined by the configuration of the optical system 20 and the optical conditions of the optical system 20, and the aberrations other than defocusing are determined based on the specified direction of defocusing.

Figure 9:
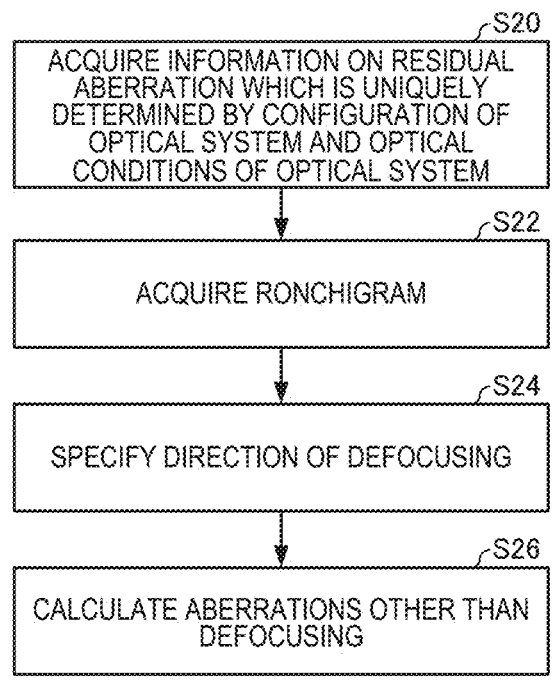
FIG. 9 is a flow chart illustrating an example of a method of measuring an aberration according to the second embodiment.

FIG. 9 is a flow chart illustrating an example of the method of measuring an aberration according to the second embodiment.

First, the information on the residual aberration that is uniquely determined by the configuration of the optical system 20 and the optical conditions of the optical system 20 is acquired (S20).

For example, in the electron microscope 200, the aberration is measured while changing the optical conditions of the optical system 20, whereby a table, in which the optical conditions of the optical system 20 and the direction of the six-fold astigmatism are associated and registered, is created.

Then a Ronchigram is acquired (S22).

A Ronchigram is a projected image of the specimen S formed on a diffraction surface by focusing the electron beam in the vicinity of the specimen S using the illumination system 22.

Then the direction of defocusing is specified based on the residual aberration which is uniquely determined by the configuration of the optical system 20 and the optical conditions of the optical system 20 (S24), and the aberrations other than defocusing are determined based on the specified direction of defocusing (S26).

Figure 10:
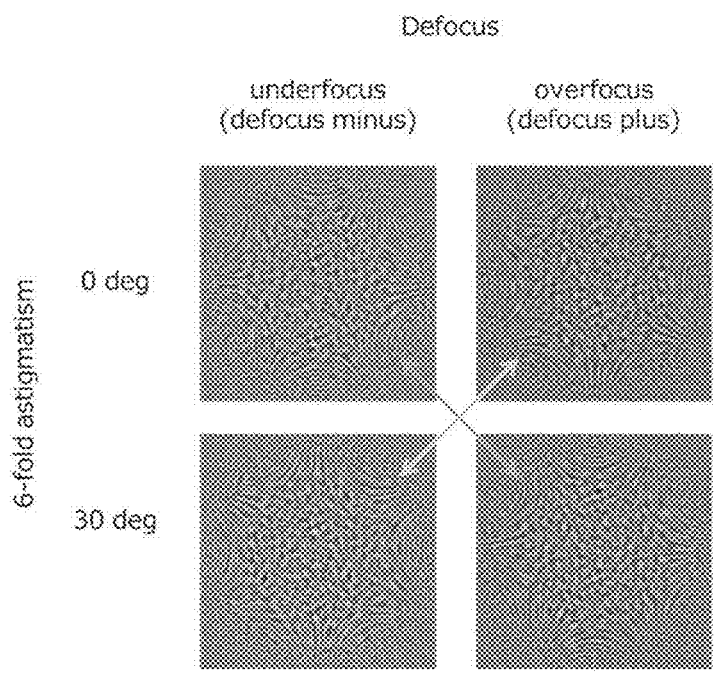
FIG. 10 illustrates a simulation result of a Ronchigram in a case where six-fold astigmatism exists.

FIG. 10 is a simulation result of a Ronchigram in a case where six-fold astigmatism exists. FIG. 10 indicates a Ronchigram in a case where defocusing is underfocus and the direction of the six-fold astigmatism is 0°, a Ronchigram in a case where defocusing is overfocus and the direction of the six-fold astigmatism is 0°, a Ronchigram in a case where defocusing is underfocus and the direction of the six-fold astigmatism is 30°, and a Ronchigram in a case where defocusing is overfocus and the direction of the six-fold astigmatism is 30°.

As indicated in FIG. 10, the Ronchigram in the case where defocusing is underfocus and the six-fold astigmatism is 0° and the Ronchigram in a case where defocusing is overfocus and the six-fold astigmatism is 30° have the same pattern, and are not distinguishable. Further, the Ronchigram in the case where defocusing is overfocus and the six-fold astigmatism is 0° and the Ronchigram in the case where defocusing is underfocus and the six-fold astigmatism is 30° have the same pattern, and are not distinguishable.

In the method of correcting an aberration according to the second embodiment, the direction of defocusing is determined based on the residual aberration which is uniquely determined by the configuration of the optical system 20 and the optical conditions of the optical system 20, in the same manner as the method of correcting an aberration according to the first embodiment. For example, the direction of defocusing can be specified by acquiring information that the direction of the six-fold astigmatism generated in the aberration correction device 224 is 30° in advance, for example.

Figure 11:
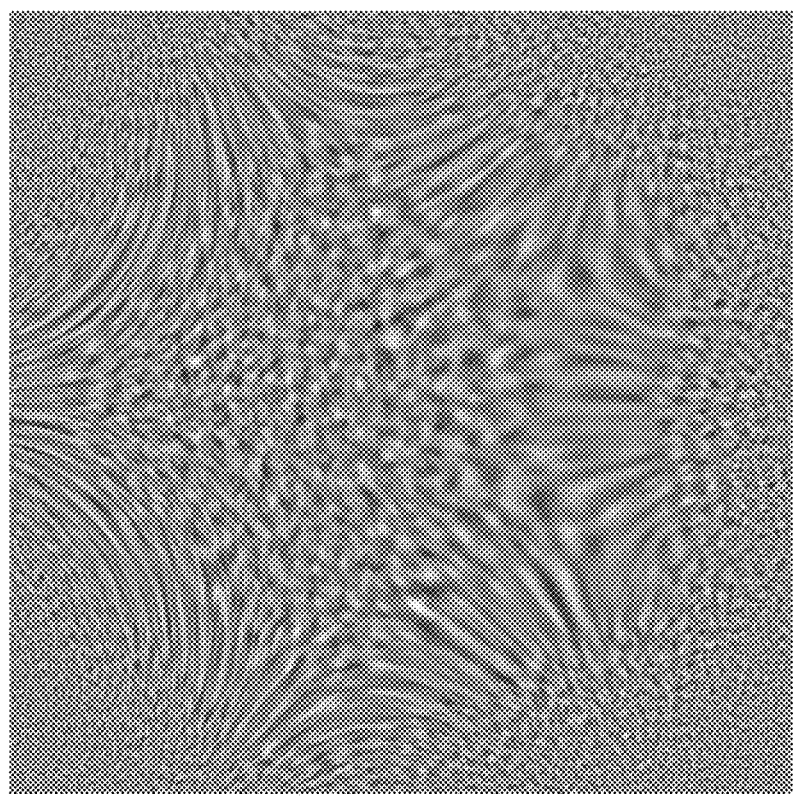
FIG. 11 illustrates an example of a simulation result of a Ronchigram in a case where a coma aberration exists.

FIG. 11 is an example of a simulation result of a Ronchigram in a case where a coma aberration exists.

When the aberration is calculated using the Ronchigram indicated in FIG. 11, solution A and solution B are acquired as follows.

Solution A
Six-fold astigmatism: 0°
Direction of defocusing: underfocus
Coma aberration: 0°
Solution B
Six-fold astigmatism: 30°
Direction of defocusing: overfocus
Coma aberration: 180°

Here, if it is known that the direction of the six-fold astigmatism generated in the aberration correction device 224 is 30°, then the Solution B is the correct aberration measuring result.

In the above mentioned example, the case of determining the direction of the coma aberration based on the direction of the six-fold astigmatism, which is the residual aberration of the aberration correction device 224, was described, but in the Ronchigram, the magnitude (amplitude) of the aberration can also be measured. For example, in the example indicated in FIG. 11, the following solution is acquired.

Solution
Six-fold astigmatism: 10 mm, 30°
Direction of defocusing: +200 nm, overfocus
Coma aberration: 2500 nm, 180°

In the above example, the direction of the six-fold astigmatism generated in the aberration correction device 224 that is uniquely determined is used, but the direction of the sixth order three-lobe aberration generated in the aberration correction device 224 is also uniquely determined by the configuration of the optical system 20 and the optical conditions of the optical system 20. Therefore based on the assumption (constraint condition) that the sixth order three-lobe aberration, which is the residual aberration of the aberration correction device 224, exists, the direction of defocusing may be specified using the Ronchigram acquired in step S22.

Further, in the above example, the case where the coma aberration exists in the illumination system 22 was described, but the aberration can be calculated in the same manner even in a case where an aberration other than the coma aberration (e.g. two-fold astigmatism, three-fold astigmatism, start aberration) exists in the illumination system 22.

2.3. Processing

In the electron microscope 200, the control device 50 performs the aberration measurement processing to measure an aberration of the illumination system 22. Further, the control device 50 performs the aberration correction processing to correct aberration by controlling the aberration correction device 224 based on the aberration measuring result. In the storage unit 524, a table, in which the optical conditions of the optical system 20 and the direction of the six-fold astigmatism are associated and registered, is stored in advance.

Figure 12:
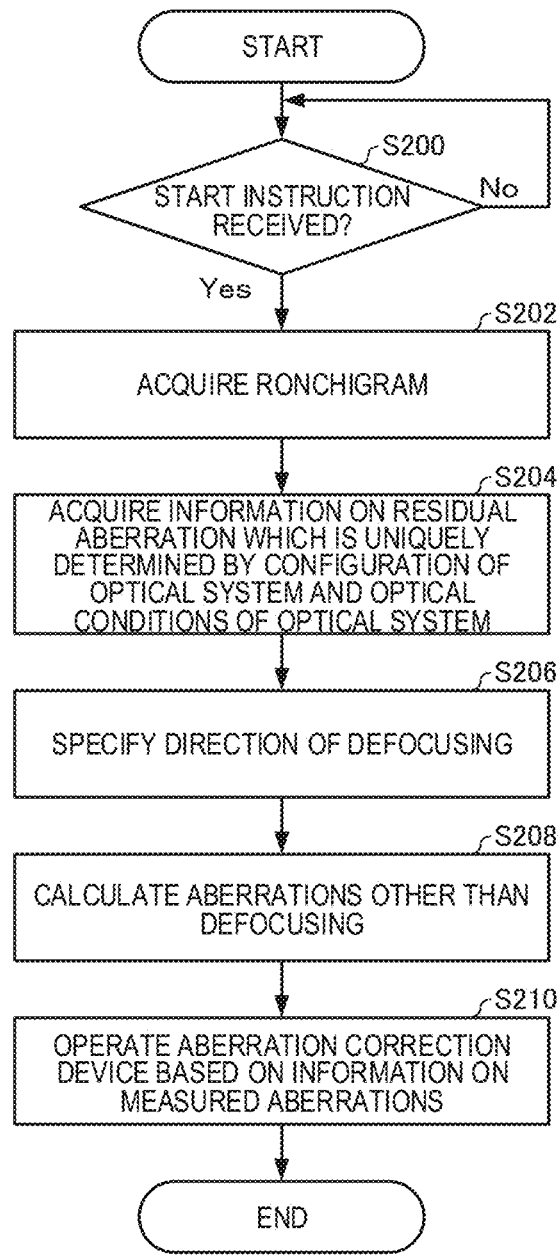
FIG. 12 is a flow chart illustrating an example of aberration measurement processing and aberration correction processing.

FIG. 12 is a flow chart illustrating an example of the aberration measurement processing and the aberration correction processing.

The processing unit 510 determines whether the user instructed a start of aberration correction (S200).

In a case where it is determined that the start was instructed (Yes in S200), the image acquiring unit 512 performs the processing to acquire the Ronchigram (S202).

Then the aberration calculating unit 514 measures the aberration using the Ronchigram acquired by the image acquiring unit 512.

Specifically, first the aberration calculating unit 514 acquires the information on the residual aberration that is uniquely determined by the configuration of the optical system 20 and the optical conditions of the optical system 20 (S204). With reference to the table stored in the storage unit 524, the aberration calculating unit 514 acquires the information on the direction of the six-fold astigmatism, in accordance with the optical conditions used when the image acquiring unit 512 acquired the Ronchigram. Then in the Ronchigram, the aberration calculating unit 514 specifies the direction of defocusing based on the acquired information on the direction of the six-fold astigmatism (S206), and determines aberrations other than defocusing based on the specified direction of defocusing (S208). By the above processing steps, the aberration of the optical system 20 can be measured. After the processing step S208, the processing unit 510 ends the aberration measurement processing.

After the aberration measurement processing ends, the aberration correction device control unit 516 operates the aberration correction device 224 so that the aberration is corrected based on the information on the measured aberration (S210). By the above processing steps, the aberration of the illumination system 22 can be corrected. After the processing step S210, the processing unit 510 ends the aberration correction processing.

2.4. Effects

In the electron microscope 200, the aberration calculating unit 514 specifies the direction of defocusing based on the residual aberration that is uniquely determined by the configuration of the optical system 20 and the optical conditions of the optical system 20. Therefore an aberration can be easily measured without checking the direction of defocusing in advance or changing defocusing. Furthermore, the aberration can be measure using one Ronchigram without acquiring a plurality of Ronchigrams.

The invention is not limited to the above-described embodiments, and various modifications can be made. For example, the invention includes configurations that are substantially the same as the configurations described in the embodiments. Substantially same configurations means configurations that are the same in function, method, and results, or configurations that are the same in objective and effects, for example. The invention also includes configurations in which non-essential elements described in the embodiments are replaced by other elements. The invention also includes configurations having the same effects as those of the configurations described in the embodiments, or configurations capable of achieving the same objectives as those of the configurations described in the embodiments. The invention further includes configurations obtained by adding known art to the configurations described in the embodiments.

Some embodiments of the invention have been described in detail above, but a person skilled in the art will readily appreciate that various modifications can be made from the embodiments without materially departing from the novel teachings and effects of the invention. Accordingly, all such modifications are assumed to be included in the scope of the invention.

What is claimed is:

1. A method of measuring an aberration in an electron microscope, the method comprising:
   acquiring an image for measuring the aberration in the electron microscope; and
   measuring the aberration by using the image,
   in measuring the aberration, a direction of defocusing being specified based on a residual aberration that is uniquely determined by a configuration of an optical system of the electron microscope and an optical condition of the optical system.

2. The method of measuring the aberration according to claim 1, wherein
   the image is a diffractogram tableau.

3. The method of measuring the aberration according to claim 1, wherein
   the image is a Ronchigram.

4. The method of measuring the aberration according to claim 1, wherein
   in measuring the aberration, a direction of defocusing is specified based on the residual aberration, and an aberration other than defocusing is determined based on the specified direction of defocusing.

5. The method of measuring an aberration according to claim 1, wherein
   the optical system comprises an aberration correction device, and
   the residual aberration is an aberration that is generated in the aberration correction device.

6. The method of measuring an aberration according to claim 1, wherein
   the optical system comprises an objective lens, and
   the residual aberration is an aberration that is generated in the objective lens.

7. An electron microscope comprising:
   an electron source that emits an electron beam;
   an optical system that acts on the electron beam;
   a detector for acquiring an image for measuring an aberration; and
   an aberration calculating unit that calculates the aberration by using the image,
   the aberration calculating unit specifying a direction of defocusing based on a residual aberration that is uniquely determined by a configuration of the optical system and an optical condition of the optical system.

8. The electron microscope according to claim 7, wherein the image is a diffractogram tableau.

9. The electron microscope according to claim 7, wherein the image is a Ronchigram.

10. The electron microscope according to claim 7, wherein
    the aberration calculating unit specifies a direction of defocusing based on the residual aberration, and determines an aberration other than defocusing based on the specified direction of defocusing.

11. The electron microscope according to claim 7, wherein
    the optical system comprises an aberration correction device, and
    the residual aberration is an aberration that is generated in the aberration correction device.

12. The electron microscope according to claim 7, wherein
    the optical system comprises an objective lens, and
    the residual aberration is an aberration that is generated in the objective lens.

13. The electron microscope according to claim 7, further comprising:
    a storage unit that stores a table in which the optical condition of the optical system and information on the residual aberration are associated and registered.

* * * * *